United States Patent
Seki et al.

(10) Patent No.: US 6,284,308 B2
(45) Date of Patent: Sep. 4, 2001

(54) MANUFACTURING METHOD OF PRINTED CIRCUIT BOARD

(75) Inventors: Yasuaki Seki; Shigenori Shiratori, both of Yokohama; Kenji Suzuki, Kawasaki, all of (JP)

(73) Assignee: Victor Company of Japan, Ltd., Yokohama (JP)

(*) Notice: Subject to any disclaimer, the term of this patent is extended or adjusted under 35 U.S.C. 154(b) by 0 days.

(21) Appl. No.: 09/461,039

(22) Filed: Dec. 15, 1999

(30) Foreign Application Priority Data

Dec. 25, 1998 (JP) .................................................. 10-369553

(51) Int. Cl.$^7$ ..................................................... B05D 5/12
(52) U.S. Cl. .......................... 427/97; 427/350; 427/385.5; 427/294
(58) Field of Search ................................. 427/97, 98, 99, 427/385.5, 350, 372.2, 294; 438/672, 675, 780, 781, 909

(56) References Cited

U.S. PATENT DOCUMENTS

| | | | |
|---|---|---|---|
| 5,011,793 | * 4/1991 | Obinata | 437/203 |
| 5,153,987 | 10/1992 | Takahashi et al. | |
| 5,208,068 | * 5/1993 | Davis et al. | 427/97 |

FOREIGN PATENT DOCUMENTS

| | | |
|---|---|---|
| 9-36544 | 2/1997 | (JP). |
| 9-232758 | 9/1997 | (JP). |

* cited by examiner

Primary Examiner—Brian K. Talbot
(74) Attorney, Agent, or Firm—Connolly Bove Lodge & Hutz

(57) ABSTRACT

In a manufacturing method of a printed circuit board comprising a process of coating insulative thermosetting resin on a surface of a printed circuit board having a blind hole and a process of filling up the insulative thermosetting resin in the blind hole, the printed circuit board coated with the insulative thermosetting resin is kept in a low pressure atmosphere of 1.3 to 666 hPa, and then the insulative thermosetting resin is hardened, so that the insulative thermosetting resin is filled up in the blind hole appropriately.

4 Claims, 4 Drawing Sheets

MANUFACTURING METHOD OF PRINTED CIRCUIT BOARD

BACKGROUND OF THE INVENTION

1. Field of the Invention

The present invention relates to a manufacturing method of a printed circuit board, particularly, relates to a manufacturing method of filling up appropriately a blind hole formed on a printed circuit board with insulative thermosetting resin

2. Description of the Related Art

Presently, a printed circuit board is required to have high packing density in accordance with development of minimizing electronic apparatuses and equipment. A multilayer printed circuit board having multilayers of wiring boards has been realized for the purpose of satisfying the demand therefor. Each wiring board of each layer is electrically and mechanically connected to each other by way of a through hole and a blind hole (or referred to a non-through hole). A blind hole is filled with insulative resin or conductive resin in accordance with usage of the blind hole, and the resin is hardened.

In a process of manufacturing a multilayer printed circuit board, it is required that the blind hole be filled efficiently and securely with resin.

Various kinds of examinations have been performed for the purpose of filling a blind hole with resin efficiently and securely. Japanese Patent Laid-open Publication No. 7-249866/1995, for example, discloses a method of filling a through hole or a blind hole provided on a substrate with hardening paste. According to the method, the filling process is completed by supplying vibration to the hardening paste, which has been temporarily filled up in a through hole or a blind hole provided on a substrate by printing process.

Japanese Patent Laid-open Publication No. 9232758/1997 discloses another filling method. According to this filling method, while manufacturing a wiring board having a blind hole by way of a process of filling up the blind hole with insulative resin in conjunction with coating the insulative resin on the surface of the wiring board, the blind hole is filled up with the insulative resin by coating the insulative resin after the inner circumference of the blind hole has been moistened with a solvent.

Each method mentioned above is an excellent method for filling up a blind hole with insulative resin However, these methods can not sufficiently remove a bubble possibly remaining in the resin filled up.

FIG. 4 typically shows a bubble 20 generating in a blind hole 6 of a printed circuit board. In FIG. 4, the blind hole 6 is formed in a resin layer 3, which is coated on a substrate 1 and hardened. The bubble 20 may generate in a resin 7 by chance, while the resin 7 has been filled up in the blind hole 6 and hardened.

As mentioned above, if a bubble remains in an insulative resin after the insulative resin has been filled up in a blind hole and hardened by heating, the bubble expands and causes a problem in that the resin 7 easily swells when the printed circuit board is exposed to high temperatures such as occurs in a soldering process thereafter. The same problem occurs if the blind hole is not sufficiently filled up with the resin.

SUMMARY OF THE INVENTION

Accordingly, in consideration of the above-mentioned problems of the prior art, an object of the present invention is to provide a manufacturing method of a printed circuit board, which can effectively and securely fill up a blind hole with insulative thermosetting resin and suppress a bubble generating in the insulative thermosetting resin as well.

In order to achieve the above object, the present invention provides, according to an aspect thereof, a manufacturing method of a printed circuit board having a blind hole which comprising the steps of coating insulative thermosetting resin on a surface of a printed circuit board so as to form an insulative thermosetting layer and so as to fill up the blind hole with the insulative thermosetting resin in a normal pressure atmosphere, keeping the printed circuit board coated with the insulative thermosetting resin in a low pressure atmosphere of 1.3 to 666 hPa and hardening the insulative thermosetting resin.

Other objects and further features of the present invention will be apparent from the following detailed description when read in conjunction with the accompanying drawings.

DETAILED DESCRIPTION OF THE PREFERRED EMBODIMENTS

Prior to describing details of the preferred embodiments, each step of a manufacturing method of a printed circuit board, which is common to all the preferred embodiments of the present invention, is depicted first.

A manufacturing method of a printed circuit board composed of more than two insulative thermosetting resin layers produced by a buildup method is depicted first with reference to an example of a two-layer printed circuit board. FIGS. 1(a) through 1(g) show a manufacturing method of a multilayer printed circuit board produced by the buildup method step by step.

Figure 1A:
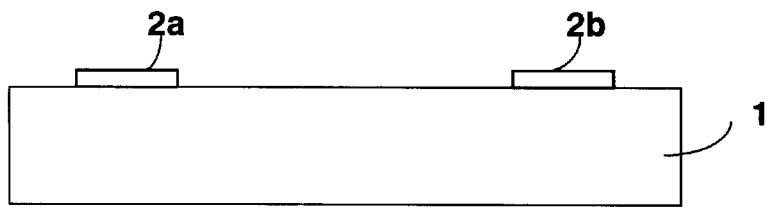
FIG. 1(a) shows a sectional view of a printed circuit board in a first step of -a manufacturing method according to an embodiment of the present invention.

At first, as-shown in FIG. 1(a), circuit patterns 2a and 2b having a predetermined width are formed on a substrate 1, which is a copper overlaid laminate or is made by plating conductive material such as copper over the substrate in a predetermined thickness.

Figure 1B:
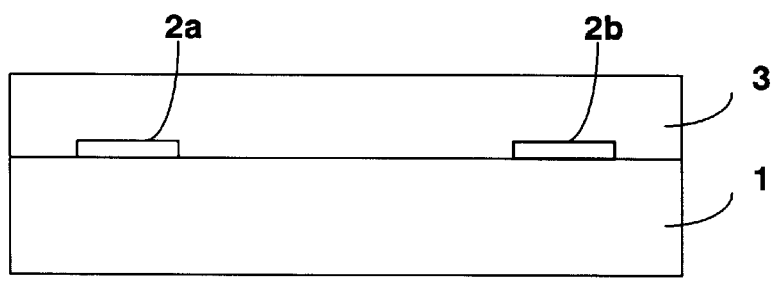
FIG. 1(b) shows. a sectional view of the printed circuit board in a second step of the manufacturing method according to the embodiment of the present invention.

Next, as shown in FIG. 1(b), insulative thermosetting resin is coated over the surface of the substrate 1 having circuit patterns 2a and 2b in a predetermined thickness and hardened, and then a first insulative thermosetting resin layer 3 is formed. The insulative thermosetting resin is coated once or a plurality of times in accordance with the required thickness and characteristics of the insulative thermosetting resin.

Figure 1C:
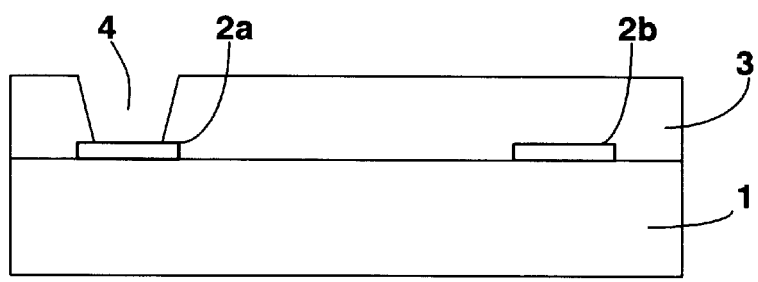
FIG. 1(c) shows a sectional view of the printed circuit board in a third step of the manufacturing method according to the embodiment of the present invention.

A part of the circuit pattern 2a is exposed by removing a part of the first insulative thermosetting resin layer 3 at a predetermined position above the circuit pattern 2a, as shown in FIG. 1(c), by the photolithographic method, a plasma treatment -or a laser processing. Accordingly, a first blind hole 4 is formed.

Figure 1D:
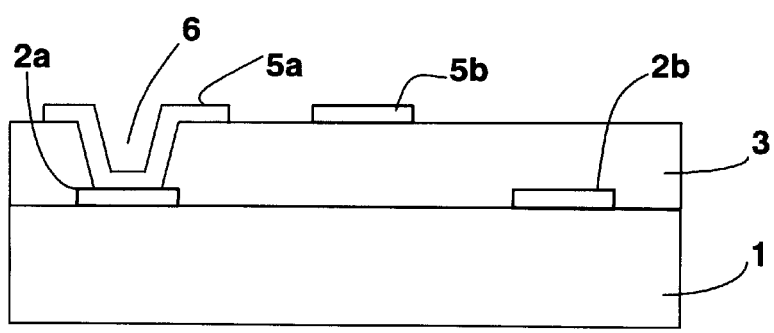
FIG. 1(d) shows a sectional view of the printed circuit board in a fourth step of the manufacturing method according to the embodiment of the present invention.

Conductive circuit patterns 5a and 5b of predetermined shapes are formed on the first insulative thermosetting resin layer 3, as shown in FIG. 1(d), by forming conductive material such as copper on the first insulative thermosetting resin layer 3 with a plating method. The inner wall of the first blind hole 4 is covered with the conductive circuit pattern 5a, and then a new first blind hole 6 is formed.

Figure 1E:
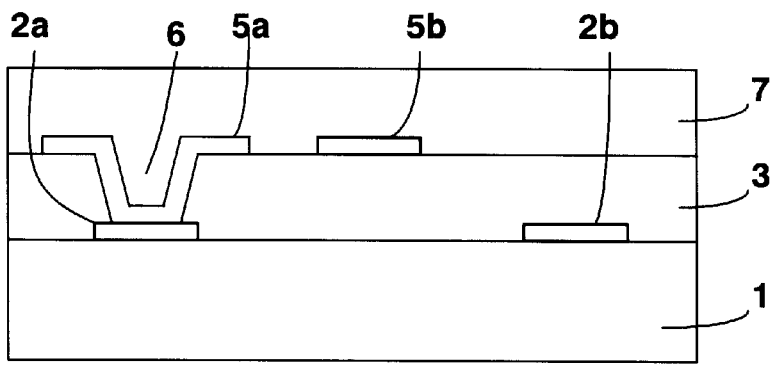
FIG. 1(e) shows a sectional view of the printed circuit board in a fifth step of the manufacturing method according to the embodiment of the present invention.

A second insulative thermosetting resin layer 7 is formed over the first insulative thermoseeting resin layer 3 and the conductive circuit patterns 5a and 5b, as shown in FIG. 1(e), by coating insulative thermosetting resin over the conductive circuit patterns 5a and 5b on the first insulative layer 3 in a predetermined thickness, and then the insulative thermosetting resin is hardened. The insulative thermosetting resin is coated once or a plurality of times in accordance with required thickness and characteristic of the insulative thermosetting resin.

Figure 1F:
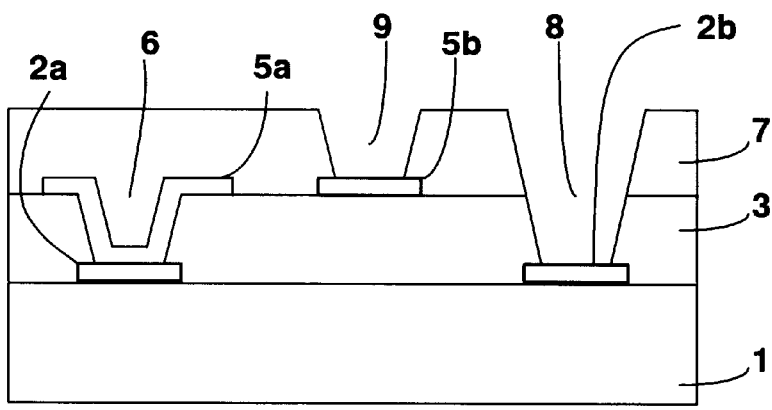
FIG. 1(f) shows a sectional view of the printed circuit board in a sixth step of the manufacturing method according to the embodiment of the present invention.

A part of the circuit pattern 2b is exposed by removing a part of the first and second insulative thermosetting resin layers 3 and 7 at a predetermined position above the circuit pattern 2b, as shown in FIG. 1(f), by the photolithographic method, the plasma treatment or the laser processing. Accordingly, a second blind hole 8 is formed. A part of the conductive circuit pattern 5b is also exposed by removing a part of the second insulative thermosetting resin layer 7 at a predetermined position above the conductive circuit pattern 5b by the photolithographic method, the plasma treatment or the laser processing. Accordingly, a third blind hole 9 is formed.

Figure 1G:
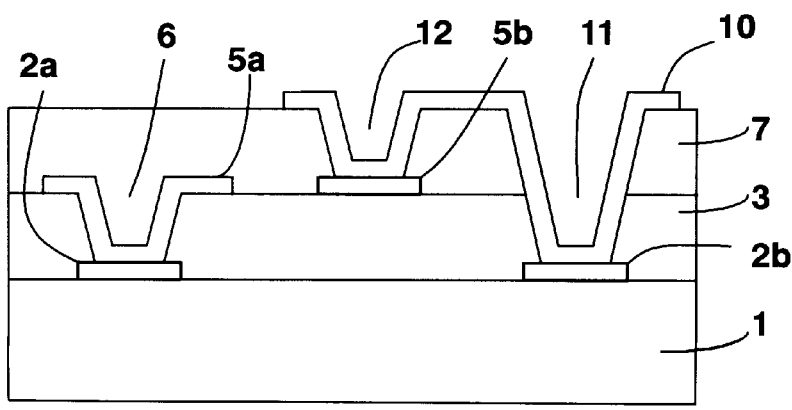
FIG. 1(g) shows a sectional view of the printed circuit board in a seventh step of the manufacturing method according to the embodiment of the present invention.

A conductive circuit pattern 10 of predetermined shape is formed on the second insulative thermosetting resin layer 7, as shown in FIG. 1(g), by forming conductive material such as copper on the second insulative thermosetting resin layer 7 and the inner walls of the second and third blind holes 8 and 9 with a plating method. The inner walls of the second and third blind holes 8 and 9 are covered with the conductive circuit pattern 10, and then new second and third blind holes 11 and 12 are formed. The conductive circuit patterns 2b and 5b are electrically connected to each other through the conductive circuit pattern 10.

Finally, a protective layer not shown is formed over the conductive circuit pattern 10 and the second insulative thermosetting resin layer 7, and then a 2 layer printed circuit board of single side is produced.

Figure 4:
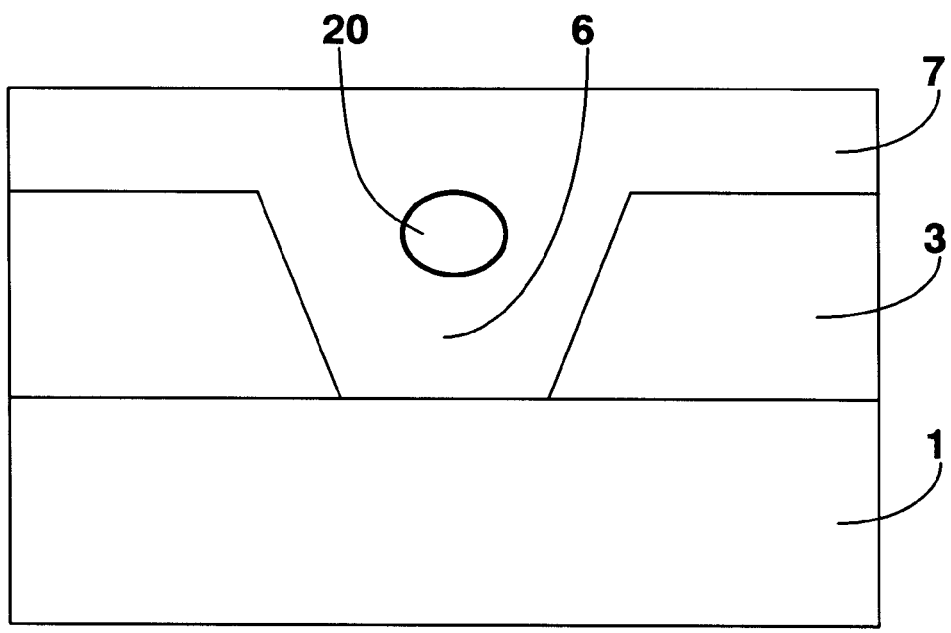
FIG. 4 shows a sectional view of a printed circuit board including a bubble generating in a resin layer when resin is filled up in a blind hole according to the manufacturing method of the prior art.

As shown in FIG. 1(e), the second insulative thermosetting resin layer 7 is formed over the first insulative thermosetting resin layer 3 by coating the insulative thermosetting resin over the first insulative thermosetting resin layer 3 and the conductive circuit patterns 5a and 5b. The coated insulative thermosetting resin also fills up the new first blind hole 6. A bubble, which is explained in the prior art with reference to FIG. 4, may be generated while hardening the coated insulative thermosetting resin.

A most suitable condition of generating no bubble has been found after various kinds of experimental studies. The condition is that a printed circuit board having blind holes on the surface is kept in a low pressure atmosphere after insulative thermosetting resin has been coated on the printed circuit board and the insulative thermosetting resin is hardened thereafter. Further, a noticeable dent may generate on a surface of the insulative thermosetting resin filled up in a blind hole if a viscosity of the insulative thermosetting resin is out of a specific range, although a printed circuit board is kept in a low pressure atmosphere and a bubble does not generate. Accordingly, it is found that the most suitable condition for obtaining a best result is to keep a viscosity of insulative thermosetting resin within a predetermined range while keeping the insulative thermosetting resin in a low pressure atmosphere.

After insulative thermosetting resin has been coated over a surface of an insulative thermoseeting resin layer having a blind hole formed on a printed circuit board, a bubble does not generate in the blind hole if the printed circuit board is placed in a vacuum chamber with a low atmospheric pressure of in the range of 1.3 to 666 hPa (hectoPascal), more suitably 40 to 400 hPa, and then the insulative thermosetting resin is hardened by a predetermined hardening -process. If the atmospheric pressure is less than 1.3 hPa, bumping occurs in the insulative thermosetting resin and many bubbles generate. On the other hand, if the atmospheric pressure exceeds 666 hPa, a bubble can hardly be deflated.

Figure 2:
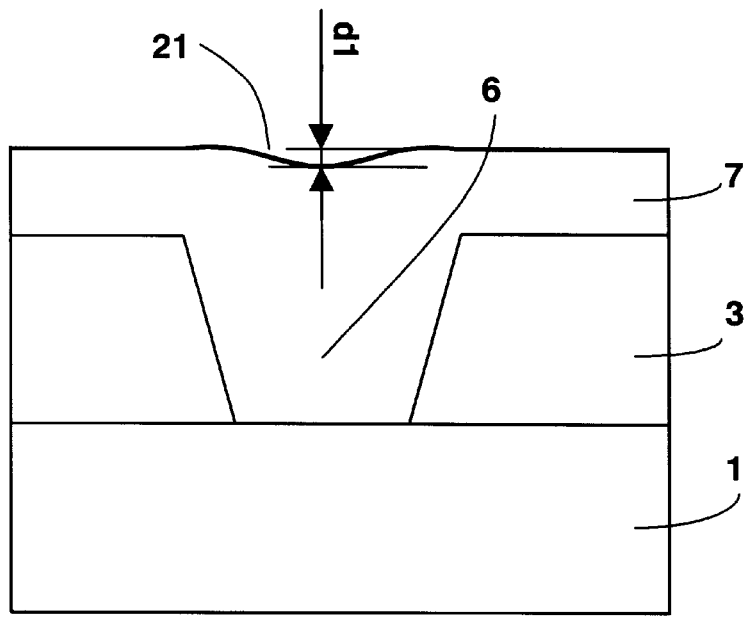
FIG. 2 shows a sectional view of a printed circuit board when insulative thermosetting resin is filled up in a blind hole according to the embodiment of the present invention.

FIG. 2 shows a sectional view of a printed circuit board of which a blind hole 6 is filled up with insulative thermosetting resin, and the insulative thermosetting resin is hardened according to the embodiment of the present invention. It is preferable for a printed circuit board that a depth d1 of a dent 21 be shallow and more preferably be within a range of 0 to 5 $\mu$m. A shallower dent prevents a growth of a defect such as an open-circuit or a short-circuit while forming -a conductive circuit pattern across the dent.

Further, a blind hole is sufficiently filled up with insulative thermosetting resin and a bubble does not generate in the blind hole if a printed circuit board is placed in a vacuum chamber with keeping a low atmospheric pressure in the range of 1.3 to 666 hPa, more suitably 40 to 400 hPa, and the insulative thermosetting resin is hardened by a predetermined hardening process, after the insulative thermosetting resin having a viscosity of 0.1 to 15 Pa.s (Pascal-second) has been coated over a surface of a insulative thermosetting resin layer having the blind hole, which is formed on the printed circuit board.

Figure 3:
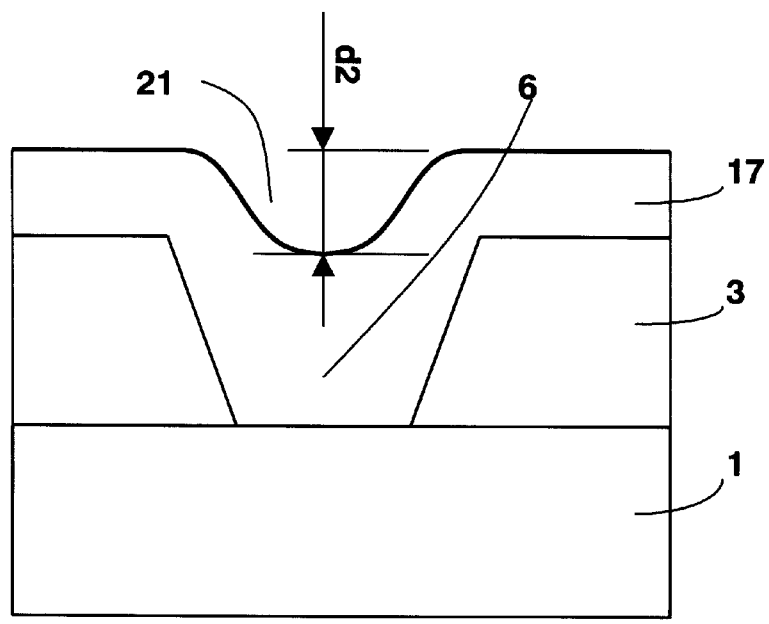
FIG. 3 shows a sectional view of a printed circuit board when high-viscosity resin is filled up in a blind hole according to a comparative example of the present invention.

FIG. 3 shows a sectional view of a printed circuit board when high-viscosity resin has filled up a blind hole according to a comparative example of the present invention. FIG. 3 typically shows a case wherein a viscosity of insulative thermosetting resin to be coated is high. If the viscosity exceeds 25 Pa.s, a depth d2 of the dent 21 extends to 10 $\mu$m, in a case that a thickness of the insulative thermosetting resin layer 3 is approximately 30 $\mu$m. A deep dent is not suitable for forming a conductive circuit pattern. If the viscosity is less than 0.1 Pa.s, it is hard to coat the insulative thermosetting resin stably or securely.

[Embodiment 1]

As shown in each drawing of FIGS. 1(a) through 1(g), a copper layer having a thickness of approximately 5 μm is formed on a surface of a glass based epoxy substrate 1 by a plating method. Predetermined conductive circuit patterns 2a and 2b are formed by the photolithographic method as shown in FIG. 1(a). Epoxy resin is coated over the substrate 1 and the conductive circuit patterns 2a and 2b with the curtain coat method or the spray coat method and hardened by heating, and then an epoxy resin layer 3 having a thickness of approximately 30 μm is obtained as shown in FIG. 1(b). The blind hole 4 having a diameter of approximately 50 μm is formed on the epoxy resin layer 3 at a predetermined position of the conductive circuit pattern 2a by using a carbon dioxide laser as shown in FIG. 1(c) Next, a copper layer having a thickness of approximately 5 μm is formed over the epoxy resin layer 3 and the blind hole 4 with the plating method, and then a predetermined conductive circuit patterns 5a and 5b are formed by the photolithographic method as shown in FIG. 1(d).

As shown in FIG. 1(e), epoxy resin of which viscosity is adjusted to approximately 0.5 Pa.s by being diluted with organic solvent such as propylene glycol mono-methyl ether acetate (PGMAC) which is coated over the epoxy resin layer 3 and the conductive circuit patterns 5a and 5b by the curtain coat method or the spray coat method. The substrate 1 with 2 layers of insulative thermosetting resin is placed in a vacuum chamber after coating and an atmospheric pressure is reduced to 666 hPa. The substrate 1 is taken out from the vacuum chamber and the epoxy resin layer 7 is hardened by heating at a temperature of 100 to 200° C. and finally a first printed circuit board is produced.

A cross sectional shape of a blind hole is carefully investigated after cutting the first printed circuit board into two. However, a bubble, which causes a problem in practical application, or a dent 21 shown in FIG. 2 is not found.

[Embodiment 2]

A second printed circuit board is produced by the same manufacturing method as that of the embodiment 1 mentioned above except an atmospheric pressure of the vacuum chamber. An atmospheric pressure in this embodiment 2 is reduced to 400 hPa. A cross sectional shape of a blind hole is carefully investigated after cutting the second printed circuit board. However, a bubble, which causes a problem in practical application, or a dent 21 shown in FIG. 2 is not found.

[Embodiment 3]

A third printed circuit board is produced by the same manufacturing method as that of the embodiment 1 except at an atmospheric pressure which has been reduced to 40 hPa in this embodiment. A cross sectional shape of a blind hole is carefully investigated after cutting the third printed circuit board. However, a bubble, which causes a problem in practical application, or a dent 21 shown in FIG. 2 is not found.

[Embodiment 4]

A fourth printed circuit board is produced by the same manufacturing method as that of the embodiment 1 except at an atmospheric pressure which has been reduced to 1.3 hPa in this embodiment. A cross sectional shape of a blind hole is carefully investigated after cutting the fourth printed circuit board. However, a bubble, which causes a problem in practical application, or a dent 21 shown in FIG. 2 is not found.

[Embodiment 5]

A fifth printed circuit board is produced by the same manufacturing method as that of the embodiment 1 except for the coating of insulative thermosetting resin. The insulative thermosetting resin layer 7 is formed by coating insulative themosetting resin a plurality of times over the circuit patterns 5a and 5b and the epoxy resin layer 3. A cross sectional shape of a blind hole is carefully investigated after cutting the fifth printed circuit board However, a bubble, which causes a problem in practical application, or a dent 21 shown in FIG. 2 is not found.

[Embodiment 6]

A sixth printed circuit board is produced by the same manufacturing method as that of the embodiment 5 except at atmospheric pressure. The sixth printed circuit board is produced without keeping it in a low atmospheric pressure after a second coating of insulative thermosetting resin for forming the insulative thermosetting resin layer 7. A cross sectional shape of a blind hole is carefully investigated after cutting the sixth printed circuit board. However, a bubble, which causes a problem in practical application, or a dent 21 shown in FIG. 2 is not found.

COMPARATIVE EXAMPLE 1

A eleventh printed circuit board is produced by the same manufacturing method as that of the embodiment 1 except at an atmospheric pressure which has been reduced to 0.7 hPa in this comparative example. A cross sectional shape of a blind hole is carefully investigated after cutting the eleventh printed circuit board. Many bubbles generate all over an epoxy resin layer as well as in a blind hole. It is supposed that a bumping phenomenon occurs in relation to vapor pressure of solvent.

COMPARATIVE EXAMPLE 2

A twelfth printed circuit board is produced by the same manufacturing method as that of the embodiment 1 except at an atmospheric pressure which has been reduced to 780 hPa in this comparative example. A cross sectional shape of a blind hole is carefully investigated after cutting the twelfth printed circuit board. A bubble of 10 μm in diameter, which causes a problem in practical application, is found.

[Embodiment 7]

As shown in each drawing of FIGS. 1(a) through 1(g), a copper layer having a thickness of approximately 5 μm is formed on a surface of a glass based epoxy substrate 1 by a plating method. Predetermined conductive circuit patterns 2a and 2b are formed by the photolithographic method as shown in FIG. 1(a). Epoxy resin is coated over the substrate 1 and the conductive circuit patterns 2a and 2b by the process of screen printing method and hardened by heating, and then an epoxy resin layer 3 having a thickness of approximately 30 μm is obtained as shown in FIG. 1(b). The blind hole 4 having a diameter of approximately 50 μm is formed on the epoxy resin layer 3 at a predetermined position of the conductive circuit pattern 2a by using a carbon dioxide laser as shown in FIG. 1(c).

Next, a copper layer having a thickness of approximately 5 μm is formed over the epoxy resin layer 3 and the blind hole 4, and then a predetermined conductive circuit patterns 5a and 5b are formed by the photolithographic method as shown in FIG. 1(d).

As shown in FIG. 1(e), epoxy resin of which viscosity is adjusted to approximately 15 Pa.s by being diluted with organic solvent such as carbitol or naphtha is coated over the epoxy resin layer 3 and the conductive circuit patterns 5a and 5b by a printing method. The substrate 1 with two layers of insulative thermosetting resin is kept in a vacuum chamber after coating and the atmospheric pressure is reduced to 666 hPa. The substrate 1 is taken out from the vacuum chamber and the epoxy resin layer 7 is hardened by heating at a temperature of 100 to 200° C. and finally a seventh printed circuit board with the epoxy resin layer 7 having a thickness of approximately 20 μm is produced.

A cross sectional shape of a blind hole is carefully investigated after cutting the seventh printed circuit board. No bubble, which causes a problem in practical application, is found. However, a shallow dent 21 of which a depth d1 shown in FIG. 2 is approximately 3 μm is found. A maximum depth d1 of a dent 21 is allowed to an extent of approximately 5 μm.

COMPARATIVE EXAMPLE 3

A thirteenth printed circuit board is produced by the same manufacturing method as that of the embodiment 5 except for the process of coating epoxy resin over the epoxy resin layer 3 and the conductive circuit pattern 5a and 5b. In this comparative example, epoxy resin viscosity is adjusted to approximately 20 Pa.s by being diluted with organic solvent such as carbitol or naphtha which is coated over the epoxy resin layer 3 and the conductive circuit patterns 5a and 5b by the printing method. A cross sectional shape of a blind hole is carefully investigated after cutting the thirteenth printed circuit board. A bubble, which causes a problem in practical application, is not found. However, a dent 21 of which a depth d1 is approximately 10 μm is found. The depth is not acceptable.

[Embodiment 8]

An eighth printed circuit board is produced by the same manufacturing method as that of the embodiment 7 except for the viscosity of epoxy resin. In this embodiment 8, a viscosity of epoxy resin is adjusted to approximately 20 Pa.s by being diluted with organic solvent such as carbitol or naphtha, and the epoxy resin is coated over the epoxy resin layer 3 and the conductive circuit patterns 5a and 5b by the printing method. The substrate 1 with epoxy resin coated over the epoxy resin layer 3 is kept in the vacuum chamber and a viscosity of the epoxy resin coated over the epoxy resin layer 3 is reduced to approximately 15 Pa.s by increasing the temperature of the substrate 1. A cross sectional shape of a blind hole is carefully investigated after cutting the eighth printed circuit board. A bubble, which causes a problem in practical application, is not found. However, a dent 21 of which a depth d1 is approximately 3 μm is found. The dent depth 3 μm is allowable.

[Embodiment 9]

A ninth printed circuit board is produced by the same manufacturing method as that of the embodiment 7 except for the coating of insulative thermosetting resin The insulative thermosetting resin layer 7 is formed by coating insulative thermosetting resin a plurality of times over the circuit patterns 5a and 5b and the epoxy resin layer 3. A cross sectional shape of a blind hole is carefully investigated after cutting the ninth printed circuit board. A bubble, which causes a problem in practical application, is not found. However, a dent 21 of which a depth d1 is approximately 3 μm is found. The dent depth 3 μm is allowable.

[Embodiment 10]

A tenth printed circuit board is produced by the same manufacturing method as that of the embodiment 9 except for the atmospheric pressure. The tenth printed circuit board is produced without keeping it in a low atmospheric pressure after a second time coating of insulative thermosetting resin for forming the insulative thermosetting resin layer 7. A cross sectional shape of a blind hole is carefully investigated after cutting the tenth printed circuit board. A bubble, which causes a problem in practical application, is not found. However, a dent 21 of which a depth d1 is approximately 3 μm is found. The dent depth of 3 μm is allowable.

While the invention has been described above with reference to specific embodiments thereof, it is apparent that many changes, modifications and variations in the arrangement of equipment and devices and in materials can be made without departing from the invention concept disclosed herein. For example, a substrate and insulative thermosetting resin used in the present invention are not limited to the glass based epoxy substrate or the epoxy resin.

Any materials or configurations extensively used for a printed circuit board can be used for the present invention without any limitations. With respect to a substrate, paper based phenol resin laminated substrate, paper based epoxy resin laminated substrate, paper based polyester resin laminated substrate, glass based epoxy resin laminated substrate, paper based Teflon resin laminated substrate, glass based polyimide resin laminated substrate, flexible substrate such as polyimide resin or polyester resin, rigid resin substrate such as composite resin substrate, and metal system insulative substrate composed of metal such as aluminum covered with insulative thermoseting resin such as epoxy resin are listed as representative examples.

With respect to a material of a conductive layer utilized for the present invention, any conductive materials can be used. Metallic materials such as copper, aluminum, and nickel are listed as representative examples.

The thicknesses and widths of the conductive layer of the conductive circuit pattern mentioned above are not limited. However, generally, a thickness of 4 to 70 μm and a width of more than 25 μm are suitable for a conductive circuit pattern.

With respect to insulative thermosetting resin, any type of resin such as thermosetting resin or ultraviolet ray setting resin can be used without any limitation as long as it has insulative characteristics. Epoxy resin, polyimide resin and phenol resin are representative examples. Further, photosensitive resin can also be used.

In addition thereto, with respect to organic solvent, it is not limited to PGMAC and carbitol. Various organic solvents such as the alcohol family, acetate family, ether family and petroleum naphtha family can be utilized.

The thickness of insulative thermosetting resin is not limited. However, a range of 30 to 100 μm is suitable for the thickness in general.

With respect to a coating method of insulative thermosetting resin, any processing methods such as screen printing, spray coating, curtain coating, and dye coating are acceptable.

As a removing method of insulative thermosetting resin, irradiating a pulse laser such as carbon dioxide YAG or excimer and the plasma treatment can be utilized for removing insulative thermosetting resin in the present invention. The photolithographic method can also be utilized for forming a blind hole, if photosensitive resin is used as insulative thermosetting resin.

With respect to a diameter of a blind hole, it shall not be limited to a specific value. However, a diameter in an extent of 25 to 300 μm is suitable for a blind hole in general.

According to the aspect of the present invention, there provided a manufacturing method of a printed circuit board, which comprises a process of coating insulative thermosetting resin on a surface of a printed circuit board having a blind hole and a process of filling up the insulative thermosetting resin in the blind hole. The manufacturing method is further characterized by hardening the insulative thermosetting resin while keeping the printed circuit board coated with the insulative thermosetting resin in a low pressure atmosphere of 1.3 to 666 hPa. Accordingly, the insulative thermosetting resin is prevented form generating a bubble and the blind hole is sufficiently filled up with the insulative thermosetting resin as well.

What is claimed is:

1. A manufacturing method of a printed circuit board having a blind hole comprising steps of:

coating insulative thermosetting resin on a surface of a printed circuit board having a blind hole so as to form an insulative thermosetting resin layer on the printed circuit board and so as to fill up the blind hole with the insulative thermosetting resin in a normal atmospheric pressure;

reducing pressure surrounding the printed circuit board coated with the thermosetting resin to a low pressure of 1.3 to 666 hPa;

keeping the printed circuit board coated with the insulative thermosetting resin in the low pressure atmosphere of 1.3 to 666 hPa;

increasing pressure surrounding the printed circuit board coated with thermosetting resin to the normal atmospheric pressure; and hardening the insulative thermosetting resin.

2. The manufacturing method of a printed circuit board having a blind hole in accordance with claim 1, wherein said manufacturing method is further characterized in that said insulative thermosetting resin layer is formed by coating the insulative thermosetting resin a plurality of times.

3. The manufacturing method of a printed circuit board having a blind hole in accordance with claim 2, wherein said manufacturing method is furthermore characterized in that the printed circuit board coated with the insulative thermosetting resin is kept in said low pressure atmosphere of 1.3 to 666 hPa only after a first time coating of the insulative thermosetting resin.

4. The manufacturing method of a printed circuit board having a blind hole in accordance with claim 1, wherein said manufacturing method further comprises a step of adjusting viscosity of the insulative thermosetting resin to less than 15 Pa·s (pascal second) by heating the insulative thermosetting resin while keeping the circuit board coated with the insulative thermosetting resin in the low pressure atmosphere.

* * * * *